(12) United States Patent
Sims et al.

(10) Patent No.: US 12,230,495 B2
(45) Date of Patent: Feb. 18, 2025

(54) METHOD OF DEPOSITING SILICON NITRIDE FILMS

(71) Applicant: Lam Research Corporation, Fremont, CA (US)

(72) Inventors: James S. Sims, Tigard, OR (US); Shane Tang, West Linn, OR (US); Vikrant Rai, Sherwood, OR (US); Andrew McKerrow, Lake Oswego, OR (US); Huatan Qiu, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 678 days.

(21) Appl. No.: 17/285,814

(22) PCT Filed: Oct. 11, 2019

(86) PCT No.: PCT/US2019/055920
§ 371 (c)(1),
(2) Date: Apr. 15, 2021

(87) PCT Pub. No.: WO2020/081397
PCT Pub. Date: Apr. 23, 2020

(65) Prior Publication Data
US 2021/0384028 A1 Dec. 9, 2021

Related U.S. Application Data

(60) Provisional application No. 62/748,085, filed on Oct. 19, 2018.

(51) Int. Cl.
*H01L 21/02* (2006.01)
*C23C 16/455* (2006.01)
(Continued)

(52) U.S. Cl.
CPC .... *H01L 21/0217* (2013.01); *C23C 16/45536* (2013.01); *H01J 37/32174* (2013.01);
(Continued)

(58) Field of Classification Search
None
See application file for complete search history.

(56) References Cited

U.S. PATENT DOCUMENTS

| 9,984,869 B1 | 5/2018 | Blanquart |
| 10,043,656 B1 * | 8/2018 | Smith ............... H01L 21/02312 |

(Continued)

FOREIGN PATENT DOCUMENTS

| JP | 201663232 A | 4/2016 |
| KR | 20160061890 A | 6/2016 |
| KR | 10-2017-0038429 | 4/2017 |

OTHER PUBLICATIONS

International Search Report from International Application No. PCT/US2019/055920 dated Jan. 30, 2020.
(Continued)

*Primary Examiner* — Hsien Ming Lee
(74) *Attorney, Agent, or Firm* — Alleman Hall & Tuttle LLP

(57) ABSTRACT

A method for depositing a silicon nitride layer on a stack is provided. The method comprises providing an atomic layer deposition, comprising a plurality of cycles, wherein each cycle comprises dosing the stack with a silicon containing precursor by providing a silicon containing precursor gas, providing an $N_2$ plasma conversion, and providing an $H_2$ plasma conversion.

17 Claims, 3 Drawing Sheets

(51) Int. Cl.
*H01J 37/32* (2006.01)
*H01L 21/67* (2006.01)
(52) U.S. Cl.
CPC .... *H01L 21/02208* (2013.01); *H01L 21/0228* (2013.01); *H01L 21/67098* (2013.01)

(56) References Cited

U.S. PATENT DOCUMENTS

| | | |
|---|---|---|
| 2006/0022228 A1 | 2/2006 | Hoshi et al. |
| 2006/0216418 A1* | 9/2006 | Matsuura .......... C23C 16/45542 427/248.1 |
| 2013/0210241 A1 | 8/2013 | LaVoie et al. |
| 2015/0004805 A1* | 1/2015 | Omstead ................ H10B 63/84 257/770 |
| 2016/0079054 A1* | 3/2016 | Chen ................. C23C 16/45536 438/762 |
| 2016/0148806 A1* | 5/2016 | Henri ................. H01L 21/0217 438/775 |
| 2017/0062204 A1* | 3/2017 | Suzuki .............. H01L 21/02208 |
| 2018/0068844 A1 | 3/2018 | Chen et al. |
| 2019/0348271 A1* | 11/2019 | Yan ................... C23C 16/45527 |

OTHER PUBLICATIONS

Japan Patent Office, Office Action Issued in Application No. 2021521294, Oct. 17, 2023, 13 pages.
Taiwanese Office Action from Taiwanese Application No. 108137225 dated May 30, 2023.
Taiwan Intellectual Property Office, Office Action Issued in Application No. 108137225, Jan. 4, 2024, 5 pages.

* cited by examiner

METHOD OF DEPOSITING SILICON NITRIDE FILMS

CROSS REFERENCE TO RELATED APPLICATION

This application claims the benefit of priority of U.S. application Ser. No. 62/748,085, filed Oct. 19, 2018, which is incorporated herein by reference for all purposes.

BACKGROUND

The disclosure relates to methods of depositing silicon nitride films. More specifically the disclosure relates to depositing silicon nitride films using atomic layer deposition.

SUMMARY

To achieve the foregoing and in accordance with the purpose of the present disclosure, a method for depositing a silicon nitride layer on a stack is provided. The method comprises providing an atomic layer deposition, comprising a plurality of cycles, wherein each cycle comprises dosing the stack with a silicon containing precursor by providing a silicon containing precursor gas, providing an $N_2$ plasma conversion, and providing an $H_2$ plasma conversion.

In another manifestation, an apparatus for depositing a silicon nitride atomic layer deposition on a stack is provided. A process chamber is provided. A substrate support is within the process chamber. A gas inlet provides a gas into the process chamber. A gas source provides the gas to the gas inlet, where the gas source comprises a silicon containing precursor source, an $N_2$ gas source, and an $H_2$ gas source. An exhaust pump is provided for pumping gas from the process chamber. An electrode provides RF power in the process chamber. At least one power source provides power to the electrode. A controller is controllably connected to the gas source and the at least one power source. The controller comprises at least one processor and computer readable media. The computer readable media comprises computer code for depositing by atomic layer deposition a silicon nitride layer on a stack by providing a plurality of cycles, wherein each of the cycles of the plurality of cycles, comprises dosing the stack with a silicon containing precursor by providing a silicon containing precursor gas from the silicon containing precursor source, providing an $N_2$ plasma conversion and providing an $H_2$ plasma conversion.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Conformal plasma-enhanced atomic layer deposition (PEALD) of silicon nitride (SiN) films deposited between 150° C. and 450° C. face the challenge of achieving a low wet etch rate (WER) targets with simultaneous high growth rates. Since halide-based silicon precursors are the only atomic layer deposition (ALD) SiN silicon precursors known to be able to achieve 100% conformality in this temperature regime, simultaneous low WER and high growth rate films typically require some combination of nitrogen ($N_2$) and ammonia ($NH_3$) in the nitride conversion plasma. $N_2$ plasma leads to low WER, while $NH_3$ plasma leads to high growth rates and conformality. Unfortunately, the use of $NH_3$ results in undesired side effects. The high reactivity of $NH_3$ can lead to upstream particle generation and metals corrosion when the $NH_3$ reacts with residual halide-based silicon precursors. These reactions lead to excessive particle generation and the liberation of volatile halide-based acid byproducts that can attack metal chamber components. Removing $NH_3$ from the conversion plasma results in low growth rates (<0.3 Å/cycle) and requires long radio frequency (RF)-on times to get a fully conformal film (>8 seconds (s)). Both of these effects lead to very low throughput (tpt) that makes the film commercially unattractive.

The current low WER, high growth rate conformal ALD SiN processes typically use a combination of $N_2$ and $NH_3$ plasmas to convert the Si—X (X=halide or hydrogen atoms) ligands to —Si—N— bonds. The problems associated with $NH_3$ are high particle generation and high chamber corrosion rates. For encapsulation applications, $NH_3$-plasma is known to promote high elemental loss when deposited on top of sensitive chalcogenide materials. In addition, $NH_3$ plasmas, in general, promote the incorporation of large amounts of —$NH_x$ moieties that lead to high WERs in dilute hydrofluoric acids (dHF).

EXAMPLE

Figure 1:
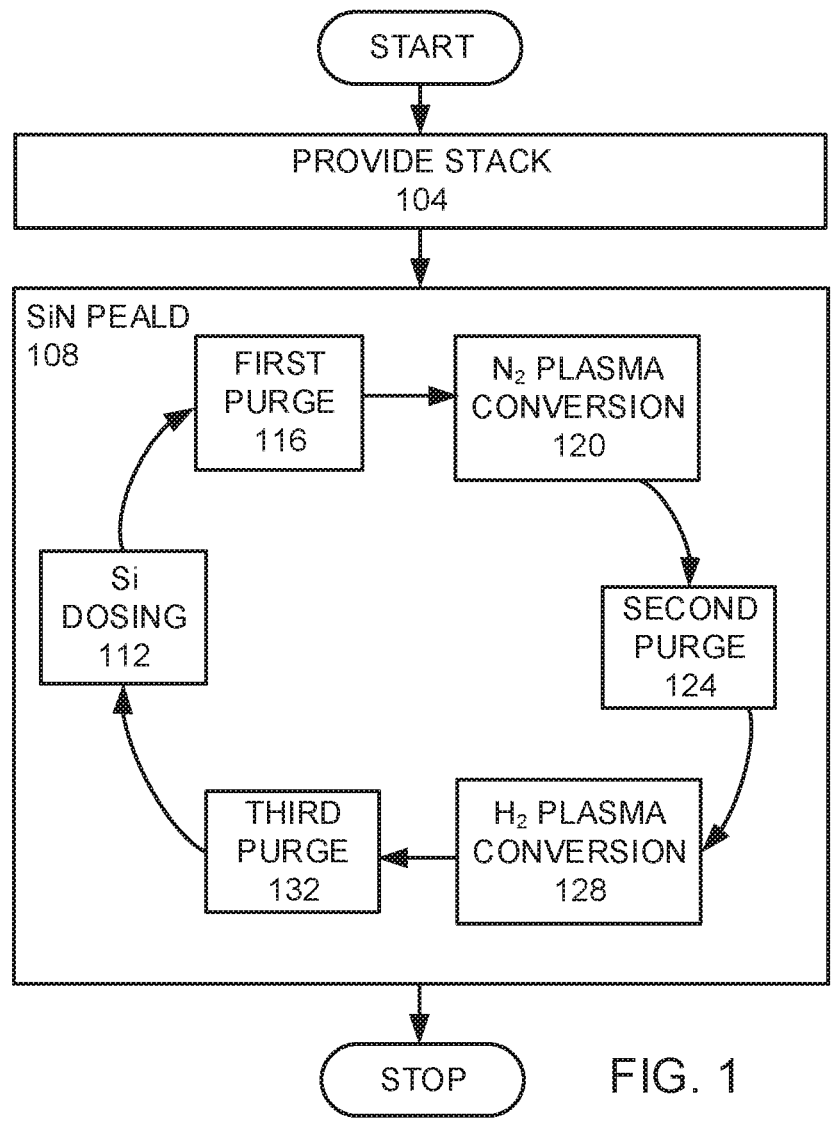
FIG. 1 is a high level flow chart of an embodiment.
Figure 2A:
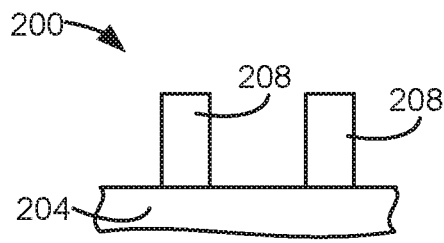
FIGS. 2A-2B are schematic cross-sectional views of a stack processed according to an embodiment.

To facilitate understanding, FIG. 1 is a high level flow chart of an embodiment. A stack is provided (step 104). FIG. 2A is a schematic cross-sectional view of a stack 200 in an embodiment. The stack 200 may comprise a substrate 204 with structures 208 formed over the substrate 204. In this example, the stack 200 forms a phase-change random access memory (PRAM).

A SiN layer is deposited over the stack 200 by a SiN ALD process (step 108). In this embodiment, the SiN ALD process is a SiN PEALD process. The SiN layer is used to encapsulate the PRAM. In this embodiment, the ALD process comprises a plurality of cycles. Each cycle has a step of dosing the stack with a silicon containing precursor gas (step 112). In this example, the dosing of the stack comprises heating the stack to a temperature of about 400° C. In this example, the silicon containing precursor case is a diiodosilane ($H_2SiI_2$) vapor. For between about 0.5 to 1.5 seconds, the dosing is completed and the flow of the silicon containing precursor gas is stopped. In this embodiment, the dosing of the stack (step 112) is a plasmaless or plasma free process. A plasma-free dose enables a more conformal, saturated half-reaction than a process that uses a plasma by ensuring that the adsorption of the Si-containing species is self-limiting.

After the dosing (step 112) is completed and the flow of the silicon containing precursor gas is stopped, a first purge is provided (step 116) to purge the silicon containing precursor gas. In this example, the first purge (step 116) comprises flowing a first purge gas. In this example, the first purge gas is $N_2$. In this example, the first purge is a plasmaless or plasma free process. The process is plasma free to prevent forming a silicon containing plasma. After about 0.25 seconds, the first purge (step 116) is stopped.

After the first purge (step 116) is completed an $N_2$ plasma conversion is provided (step 120). In this example, the flow of $N_2$ during the first purge (step 116) continues, however, the $N_2$ plasma conversion provides a plasma. In this example, sufficient RF power is provided to transform $N_2$ gas into an $N_2$ plasma. No bias is applied. The stack is exposed to the $N_2$ plasma to provide the silicon nitride conversion. By using a hydrogen-free conversion, the film has very few $NH_x$ bonds, which results in a low WER in dilute HF acid. The $N_2$ plasma conversion is provided for between 3 to 5 seconds. After the $N_2$ plasma conversion (step 120) is completed the flow of $N_2$ is stopped.

In this example, after the $N_2$ plasma conversion (step 120) is completed and the flow of $N_2$ gas is stopped, an optional second purge may be provided (step 124).

In this example, a second purge gas of Ar may be provided. In this example, the RF power is continued in order to maintain a plasma.

After the second purge is completed (step 124) a hydrogen ($H_2$) plasma conversion is provided (step 128). In this example, an $H_2$ gas is flowed. The $H_2$ gas is transformed into an $H_2$ plasma. In this embodiment, the RF power provided during the $H_2$ plasma conversion (step 128) is higher than the RF power provided during the $N_2$ plasma conversion (step 120). No bias is applied. The stack is exposed to the $H_2$ plasma to hydrogenate the surface and make it more reactive to an incoming halide molecule. The $H_2$ plasma conversion is provided for between 1 to 2 seconds. After the $H_2$ plasma conversion (step 128) is completed the flow of $H_2$ is stopped.

In this example, after the $H_2$ plasma conversion (step 128) is completed and the flow of $H_2$ gas is stopped, a third purge is provided (step 132). In this example, a third purge gas of $N_2$ is provided. In this example, the RF power is stopped to extinguish the plasma. In this example, the third purge is provided for between about 0.25 to 0.75 seconds. After the third purge is completed, the flow of the third purge gas is stopped and the cycle is completed. The cycle again goes back to the Si dosing (step 112) and the process is performed for a plurality of cycles.

Figure 2B:
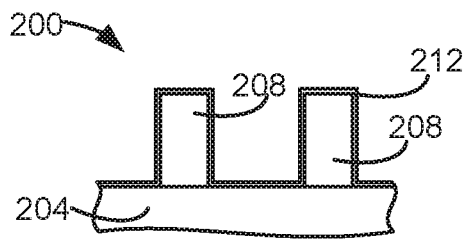

FIG. 2B is a schematic cross-sectional view of the stack 200 after a SiN layer 212 has been conformally deposited on the stack through the SiN ALD process (step 108). The PEALD process provides a highly conformal SiN layer 212.

The resulting SiN layer 212 may be formed with a high throughput. Various embodiments eliminate $NH_3$ from the process and still have a conformal ALD SiN film with the same high growth rate as with an $NH_3$ plasma, the same low WER as with an $N_2$ plasma, low particles, and no upstream metal corrosion. This is done by inserting an $H_2$ plasma step after the initial $N_2$ plasma step. Note that this is not simply a mixture of $N_2$ and $H_2$ in the plasma, but a discrete $H_2$ plasma step with its own optimized flow, pressure, and power, done in such a way that very high throughputs can be obtained with the aforementioned high growth rates and low WERs. It is expected that a short, dilute $H_2$ plasma may be less reactive toward PRAM chalcogenide materials and allow the development of bi-layer encapsulation layers, with the high-throughput $N_2/H_2$ ALD SiN process being deposited on top of a protective layer of $N_2$-only ALD SiN. This hybrid stack would have much higher throughput and better oxidation resistance than an $N_2$-only film of an equivalent thickness.

Various embodiments provide an $NH_3$-free process that meets the low WER (<4 angstroms per minute (Å/min) in 200:1 diluted hydrofluoric acid (dHF)) and high growth rate (>0.7 A/cycle) requirements by inserting a second $H_2$ plasma conversion step after the initial $N_2$ plasma conversion step. $H_2$ has the advantage of not being as thermally reactive with halide precursors as $NH_3$. This means there is no upstream particle generation in the gas distribution plenum (GDP). In addition, there is no upstream liberation of hydrogen iodide (HI) and hydrogen chloride (HCl) volatile byproducts that lead to metal corrosion. The $H_2$ plasma conversion adds enough reactive ligands to the growing SiN film surface to promote the next cycle of silicon precursor adsorption without incorporating excessive —NHx bonds that lead to high wet etch rates.

What is unexpected about this ALD SiN deposition process is that this embodiment can still achieve high conformality and high growth rates with a much less reactive nitrogen source than $NH_3$. In addition, the in-film particle adders have been reduced by 2-3 orders of magnitude. Various embodiments enable the optimization of sequential $N_2$ and $H_2$ plasma steps that result in best in class film properties and productivity. The elimination of $NH_3$ can also lead to large cost reductions in tool costs since the expectation is that less aggressive metals reduction strategies can be employed, and the need for expensive dual-plenum designs to separate $NH_3$ from the residual silicon precursor is eliminated.

In some embodiments, the second purge (step 124) may be eliminated. In such an embodiment, the $N_2$ gas is flowed first. The $H_2$ gas is flowed after the start of the flow of the $N_2$ gas and while the $N_2$ gas continues to flow so that the $H_2$ gas and $N_2$ gas flow together for some of the time. In another embodiment, the flow of the $N_2$ gas is stopped before the flow of the $H_2$ begins. However, without a second purge (step 124) there is some mixing of remaining $N_2$ gas with $H_2$ gas. The elimination of the second purge (step 124) reduces processing time and increases throughput.

In various embodiments, the silicon containing precursor is at least one of a silicon halide. In various embodiments, silicon iodides, such as diiodosilane ($H_2SiI_2$), triiodosilane ($HSiI_3$), iodosilane ($H_3SiI$), or tetraiodosilane ($SiI_4$), would provide a preferred silicon containing precursor. In other embodiments, the silicon halide may be silicon chlorides or silicon bromides. Preferably, in addition to the silicon halide having at least one halogen attached to at least one silicon atom, the silicon halide may also have one or more hydrogen atoms attached to the at least one silicon atom. In other embodiments, the silicon halide may at least one halogen attached to at least one silicon atom and at least one of an atom of another element attached to the at least one silicon atom. These other silicon containing precursors could be amino-, amido- or alkyl-based subgroups that can act as either leaving groups, cross-linking promoters or dopants. In various embodiments, the substrate is heated to a temperature of at least 150° C. during the dosing (step 112). More specifically, the substrate is heated to a temperature of between 200° C. to 400° C. The heating provides activation energy to the silicon containing precursor to cause the silicon containing precursor to form a saturated conformal monolayer.

Figure 3:
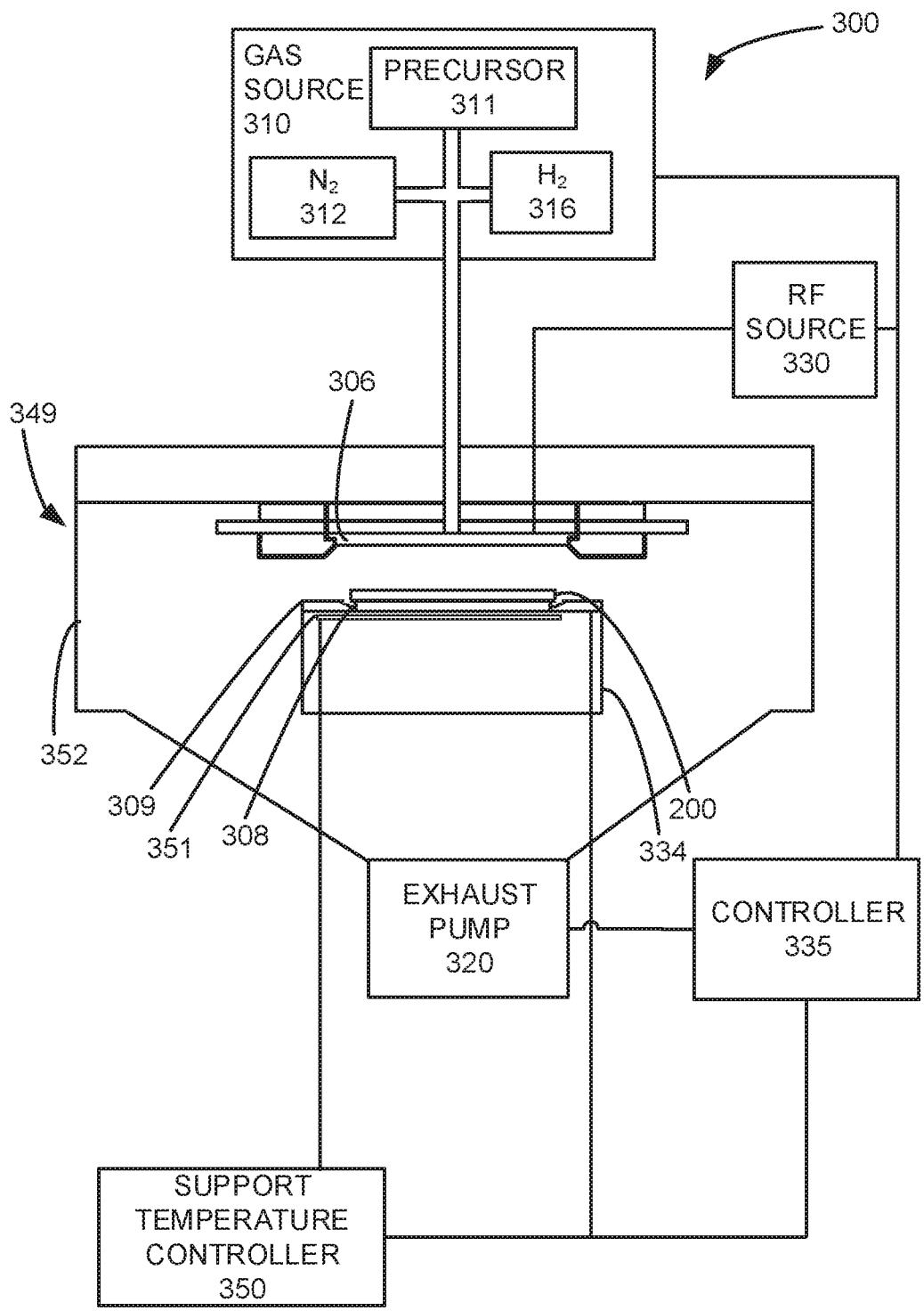
FIG. 3 is a schematic view of a process chamber that may be used in an embodiment.

FIG. 3 is a schematic view of a process chamber that may be used in an embodiment. In one or more embodiments, a process chamber 300 comprises a gas distribution plate 306 providing a gas inlet and a substrate support 308, within a chamber 349, enclosed by a chamber wall 352. Within the chamber 349, a stack 200 is positioned over the substrate support 308. An edge ring 309 surrounds the substrate support 308. A gas source 310 is connected to the chamber 349 through the gas distribution plate 306. In this example, the gas source 310 comprises a silicon containing precursor source 311, an $N_2$ gas source 312, and an $H_2$ gas source 316. A support temperature controller 350 is connected to a heater 351 for heating the substrate support 308. A radio frequency (RF) source 330 provides RF power to an upper electrode. In this embodiment, the upper electrode is the gas distribution plate 306. In an exemplary embodiment, 400 kilohertz (kHz), 13.56 megahertz (MHz), and optionally 2 MHz, 27 MHz power sources make up the RF source 330. In this embodiment, the substrate support 308 is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 335 is controllably connected to the RF source 330, an exhaust pump 320, and the gas source 310. An example of such a chamber is the Striker™ system manufactured by Lam Research Corporation of Fremont, CA.

Figure 4:
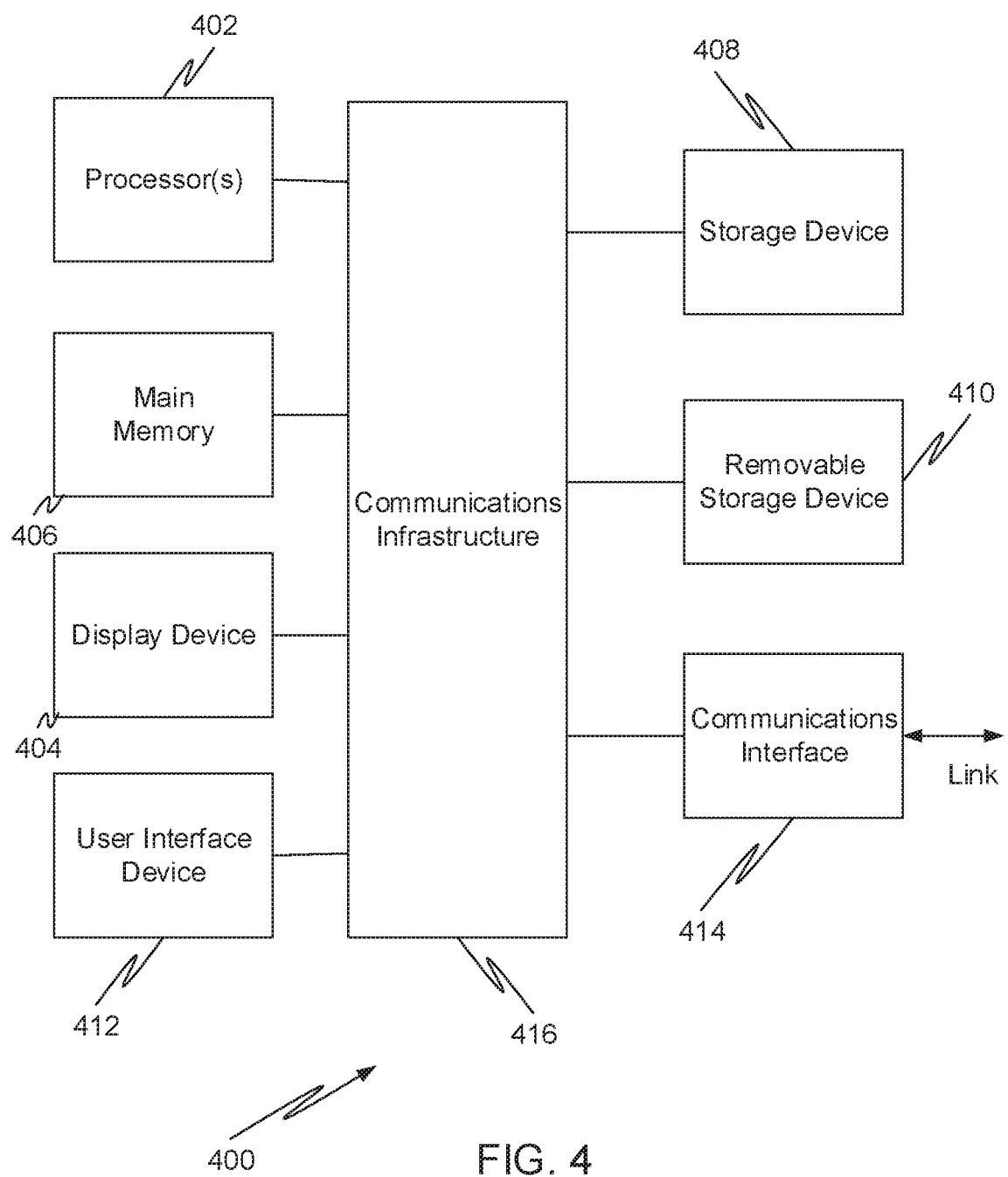
FIG. 4 is a schematic view of a computer system that may be used in practicing an embodiment.

FIG. 4 is a high level block diagram showing a computer system 400 suitable for implementing a controller 335 used in embodiments. The computer system may have many physical forms ranging from an integrated circuit, a printed circuit board, and a small handheld device up to a huge supercomputer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communications interface 414 (e.g., wireless network interface). The communications interface 414 allows software and data to be transferred between the computer system 400 and external devices via a link. The system may also include a communications infrastructure 416 (e.g., a communications bus, cross-over bar, or network) connected to the aforementioned devices/modules.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher-level code that are executed by a computer using an interpreter. Computer readable media may also be computer code transmitted by a computer data signal embodied in a carrier wave and representing a sequence of instructions that are executable by a processor.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for depositing a silicon nitride layer on a stack, comprising providing an atomic layer deposition, comprising a plurality of cycles, wherein each cycle comprises:
   dosing the stack with a silicon halide containing precursor by providing a silicon halide containing precursor gas forming a silicon precursor deposition;
   providing an $N_2$ plasma conversion after dosing the stack to convert the silicon precursor deposition to a silicon nitride deposition; and
   providing an $H_2$ plasma conversion after providing the $N_2$ plasma conversion and before a subsequent dosing of the silicon halide containing precursor to form a hydrogenated surface of the silicon nitride deposition to make the silicon nitride deposition more reactive to the silicon halide containing precursor than the silicon nitride deposition without the hydrogenated surface, wherein the subsequent dosing of the stack with the silicon halide containing precursor deposits another silicon precursor deposition on the hydrogenated surface.

2. The method, as recited in claim 1, wherein during the dosing the stack, the stack is maintained at a temperature in the range of 200° C. to 400° C.

3. The method, as recited in claim 1, wherein the dosing the stack is plasmaless.

4. The method, as recited in claim 1, wherein each cycle is $NH_3$ free.

5. The method, as recited in claim 1, wherein the providing the $N_2$ plasma conversion, comprises:
   flowing an $N_2$ gas that is hydrogen free;
   transforming the $N_2$ gas into a hydrogen free $N_2$ plasma;
   exposing the stack to the $N_2$ plasma; and
   stopping the flow of the $N_2$ gas.

6. The method, as recited in claim 5, wherein the providing the $H_2$ plasma conversion, comprises:
   flowing an $H_2$ gas;
   transforming the $H_2$ gas into an $H_2$ plasma;

exposing the stack to the $H_2$ plasma; and stopping the flow of the $H_2$ gas.

7. The method, as recited in claim 1, wherein the silicon halide containing precursor is a silicon iodide.

8. The method, as recited in claim 1, wherein the silicon halide containing precursor is a silicon chloride or silicon bromide.

9. The method, as recited in claim 1, further comprising purging an $H_2$ plasma formed by the $H_2$ plasma conversion, after providing the $H_2$ plasma conversion and before dosing the stack.

10. The method, as recited in claim 1, further comprising purging the silicon halide containing precursor gas after dosing the stack and before providing the $N_2$ plasma conversion.

11. An apparatus for depositing a silicon nitride atomic layer deposition on a stack, comprising a process chamber;

a substrate support within the process chamber;

a gas inlet for providing a gas into the process chamber;

a gas source for providing the gas to the gas inlet, wherein the gas source comprises:

a silicon containing precursor source;

an $N_2$ gas source; and an $H_2$ gas source;

an exhaust pump for pumping gas from the process chamber;

an electrode for providing RF power in the process chamber;

at least one power source for providing power to the electrode; and a controller controllably connected to the gas source and the at least one power source, wherein the controller comprises:

at least one processor; and computer readable media, comprising:

computer code for depositing by atomic layer deposition a silicon nitride layer on a stack by providing a plurality of cycles, wherein each of the cycles of the plurality of cycles, comprises:

dosing the stack with a silicon halide containing precursor by providing a silicon halide containing precursor gas from the silicon containing precursor source forming a silicon precursor deposition;

providing an $N_2$ plasma conversion after dosing the stack to convert the silicon precursor deposition to a silicon nitride deposition; and providing an $H_2$ plasma conversion after providing the $N_2$ plasma conversion to form a hydrogenated surface of the silicon nitride deposition to make the silicon nitride deposition more reactive to the silicon halide containing precursor than the silicon nitride deposition without the hydrogenated surface, wherein a subsequent dosing of the stack with the silicon halide containing precursor deposits another silicon precursor deposition on the hydrogenated surface.

12. The apparatus, as recited in claim 11, further comprising a heater for heating the substrate support.

13. The apparatus, as recited in claim 12, wherein the computer readable media further comprises computer code for heating the substrate support to a temperature in the range of 200° C. to 400° C.

14. The apparatus, as recited in claim 11, wherein the gas source is $NH_3$ free.

15. The apparatus, as recited in claim 11, wherein the providing the $N_2$ plasma conversion, comprises:

flowing an $N_2$ gas that is hydrogen free;

transforming the $N_2$ gas into a hydrogen free $N_2$ plasma;

exposing the stack to the $N_2$ plasma; and stopping the flow of the $N_2$ gas.

16. The apparatus, as recited in claim 15, wherein the providing the $H_2$ plasma conversion, comprises:

flowing an $H_2$ gas;

transforming the $H_2$ gas into an $H_2$ plasma;

exposing the stack to the $H_2$ plasma; and stopping the flow of the $H_2$ gas.

17. The apparatus, as recited in claim 11, wherein each of the cycles of the plurality of cycles, comprises:

purging the silicon halide containing precursor gas after dosing the stack and before providing the $N_2$ plasma conversion; and purging the $H_2$ plasma, after providing the $H_2$ plasma conversion and before dosing the stack.

\* \* \* \* \*